US006576904B1

United States Patent
Volkening

(10) Patent No.: US 6,576,904 B1
(45) Date of Patent: Jun. 10, 2003

(54) TRANSITION EDGE DETECTOR TECHNOLOGY FOR HIGH PERFORMANCE IR FOCAL PLANE ARRAYS

(75) Inventor: Fred Volkening, Boonsboro, MD (US)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 0 days.

(21) Appl. No.: 09/707,908

(22) Filed: Nov. 8, 2000

Related U.S. Application Data

(60) Provisional application No. 60/164,611, filed on Nov. 10, 1999.

(51) Int. Cl.$^7$ ............................................... H01L 39/00
(52) U.S. Cl. .................................. 250/338.2; 250/338.1
(58) Field of Search ........................... 250/336.2, 338.1, 250/338.2, 338.3, 338.4, 45, 176, 527, 325, 849; 374/45, 176; 327/527; 338/325; 505/849

(56) References Cited

U.S. PATENT DOCUMENTS

| | | | |
|---|---|---|---|
| 3,073,974 A | | 1/1963 | Hoh ............................ 307/149 |
| 3,243,687 A | * | 3/1966 | Hoh ............................ 250/336.2 |
| 4,250,384 A | | 2/1981 | Pulvari ........................ 250/330 |
| 4,472,239 A | | 9/1984 | Johnson et al. .............. 156/647 |
| 4,869,598 A | | 9/1989 | McDonald .................... 374/176 |
| 4,978,853 A | | 12/1990 | Hilal ........................... 250/336.2 |
| 4,983,839 A | * | 1/1991 | Deb ............................. 250/338.3 |
| 5,090,819 A | * | 2/1992 | Kapitulnik .................... 250/336.2 |
| 5,450,053 A | | 9/1995 | Wood ........................... 338/18 |
| 5,880,468 A | * | 3/1999 | Irwin et al. .................. 250/336.2 |

OTHER PUBLICATIONS

Burghartz et al, "Multilevel–Spiral Inductors Using VLSI Interconnect Technology," IEEE Electron Device Letters, vol. 17, No. 9, Sep. 1996, p. 428.

Hurley et al, "Calculation of Self and Mutual Impedances in Planar Magnetic Structures,", IEEE Transactions on Magnetics, vol. 31, No. 4, Jul. 1995, p. 2416.

Passeraub et al, "Scaling Down an Inductive Proximity Sensor,", Sensor and Actuators A52, Elsevier Science S.A., 1996 (p. 114).

* cited by examiner

Primary Examiner—Constantine Hannaher
Assistant Examiner—Otilia Gabor

(57) ABSTRACT

A microbolometer comprising a support substrate having an interrogation surface, a film of a temperature sensitive magnetic material is spaced from the interrogation surface a predetermined distance. An interrogation inductor is formed on the support substrate facing the film, and a readout circuit on the interrogation surface is electrically connected to the interrogation inductor. The temperature sensitive magnetic material has a steep, reversible change in its AC magnetic susceptibility at the magnetic Curie temperature. This structure provides a ferromagnetic transition edge bolometer adapted to reversibly change the low field magnetic susceptibility in the region corresponding to the onset of ferromagnetism (ferromagnetic Curie temperature) in response to incident IR radiation.

6 Claims, 7 Drawing Sheets

TRANSITION EDGE DETECTOR TECHNOLOGY FOR HIGH PERFORMANCE IR FOCAL PLANE ARRAYS

REFERENCE TO RELATED APPLICATION

The present application is based on provisional application Serial No. 60/164,611 filed Nov. 10, 1999 entitled TRANSITION EDGE DETECTOR TECHNOLOGY FOR HIGH PERFORMANCE IR FOCAL PLANE ARRAYS.

BACKGROUND AND BRIEF DESCRIPTION OF THE INVENTION

The present invention relates to high performance thermal imaging sensors. The proposed device technology has the potential to reach background limited performance due to a novel non-contacting measurement approach and low device noise. This invention is based on the steep, reversible change in AC magnetic susceptibility that occurs at the magnetic Curie temperature. The device is a bolometer that uses a microbridge structure to isolate the pixel. It is similar in many aspects to high $T_c$ superconducting (HTS) transition edge bolometers and ferroelectric detectors that operate at the transition edge. However, there are several key features that distinguish it from those technologies that are described below.

REFERENCES

Pulvari, U.S. Pat. No. 4,250,384, Feb. 10, 1981.
Johnson et al, U.S. Pat. No. 4,472,239, Sep. 18, 1984.
Wood, U.S. Pat. No. 5,450,053, Sep. 12, 1995.
Multilevel-spiral inductors using VLSI interconnect technology, Joachim N. Burghartz, Keith A. Jenkins, and Mehmet Soyuer, IEEE Electron Device Lett., vol 17, no 9, page 428 (1996).
Calculation of self and mutual impedances in planar magnetic structures, W. G. Hurley and M. C. Duffy, IEEE Trans. Magn., vol 31, no 4, page 2416 (1995).
Scaling down an inductive proximity sensor, Philippe A. Passeraub, Pierre-Andre Besse, and Radivoje S. Popovic, Sensors and Actuators A52, page 114 (1996).

The principal distinguishing feature between existing thermal imaging sensors and the present invention is that electrically, the device is an inductor rather than a resistor or capacitor. Since the invention uses an inductive approach to probe the temperature sensitive material, there are no connecting leads required to the microbridge element. The temperature sensitive material is suspended above, and substantially completely isolated from the underlying substrate and interrogation inductor.

Another unique feature of the invention is that the device will have an inherently high sensitivity due to the steep paramagnetic-ferromagnetic phase transition. This reversible change in the AC susceptibility (permeability) of magnetic alloys near the Curie temperature is called the Hopkinson effect, and has been demonstrated for several magnetic alloys. In addition, the resistance of the device is quite small, resulting in a reduced Johnson noise compared with standard $VO_x$ based devices.

The approach is also unique in that it allows for considerable flexibility in the pixel design, device operating temperature, and device fabrication for the following reasons:

The non-contact measurement geometry;
The wide range of Curie temperatures (covering the range. specified in the BAA from 77 K to 300 K) obtainable simply by varying the alloy composition (see FIG. 6); and
The ease of processing accorded when using simple binary metal alloys as the temperature sensing material. (Note: The same non-contacting measurement approach can be applied to HTS transition edge devices. However, HTS materials are much more complicated in comparison to the simple binary alloys proposed.)

The final unique feature is that the proposed approach brings an extensive technology base in magnetic recording head and measurement technologies to the development of microbolometer devices.

DESCRIPTION OF THE DRAWINGS

The above and other objects, advantages and features of the invention will become apparent when considered with the following specification and accompanying drawings wherein.

DETAILED DESCRIPTION OF THE INVENTION

Figure 1:
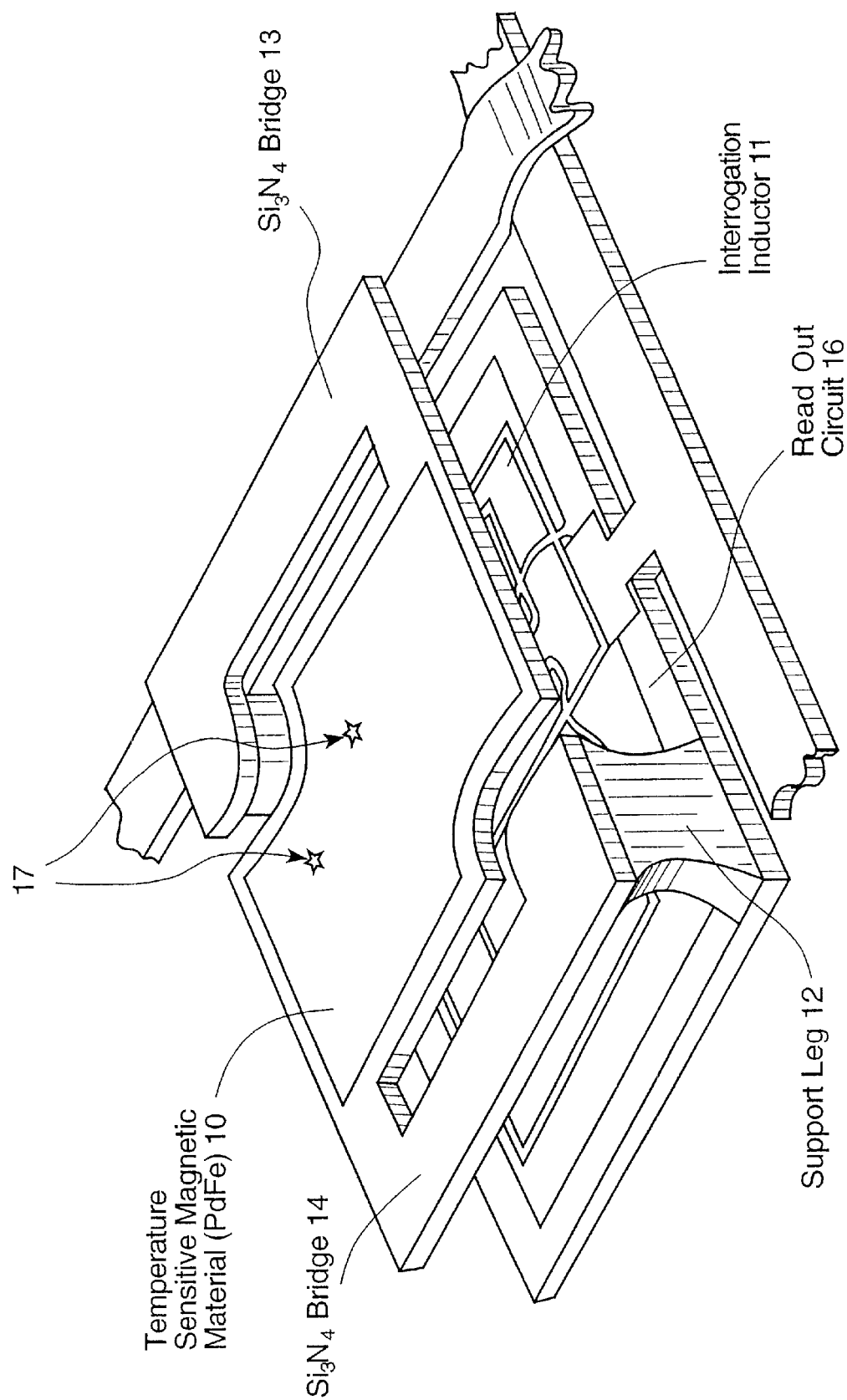
FIG. 1 is a diagrammatic illustration of a microbridge pixel structure showing isolated temperature sensitive magnetic film incorporating the invention.

According to the present invention, a ferromagnetic transition edge microbolometer relies on the steep change in magnetic permeability that occurs near the ferro/paramagnetic phase transition (Hopkinson effect). The transition temperature is called the "Curie temperature" and a transition of the permeability (AC susceptibility) changes by order of magnitude. Referring to the microbridge pixel structure shown in FIG. 1, a temperature sensitive magnetic film (PdFe) 10 is supported in isolation above a magnetic interrogation inductor 11 by support legs 12 and silicon nitride ($Si_3N_4$) bridges 13 and 14. An interrogation coil inductor 15 is coupled to a readout circuit 16. The pixel structure illustrated in FIGS. 1 and 2A has an external primary coil which is used to provide an AC magnetic field a corresponding time varying magnetization in the magnetic thin film. The pixel interrogation coil 15 geometry is optimized to detect the film magnetization. When the temperature sensitive magnetic film 10 is heated as by infrared energy 17, a steep reversible change in AC magnetic susceptibility occurs at the magnetic Curie temperature and this change in magnetic susceptibility is detected by the interrogation inductors 18 and readout circuit 19. In FIG. 2B, the primary inductor PC is located at the pixel along with the secondary inductor 15'.

Figure 2A:
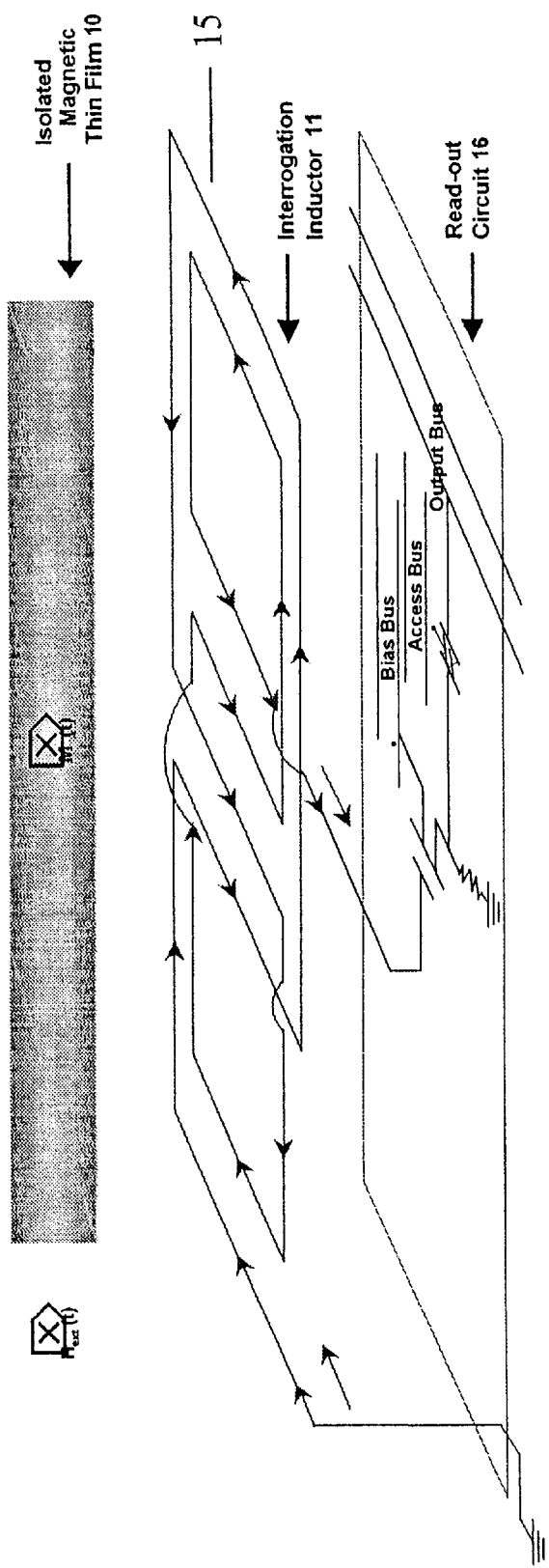
FIG. 2A is illustrates details of the pixel structure for a mutual inductance device incorporating the invention with an external primary coil or inductor so as to provide the AC magnetic field and a corresponding time varying magnetization in the magnetic thin film, the pixel coil geometry being optimized to detect the film magnetization.
Figure 2B:
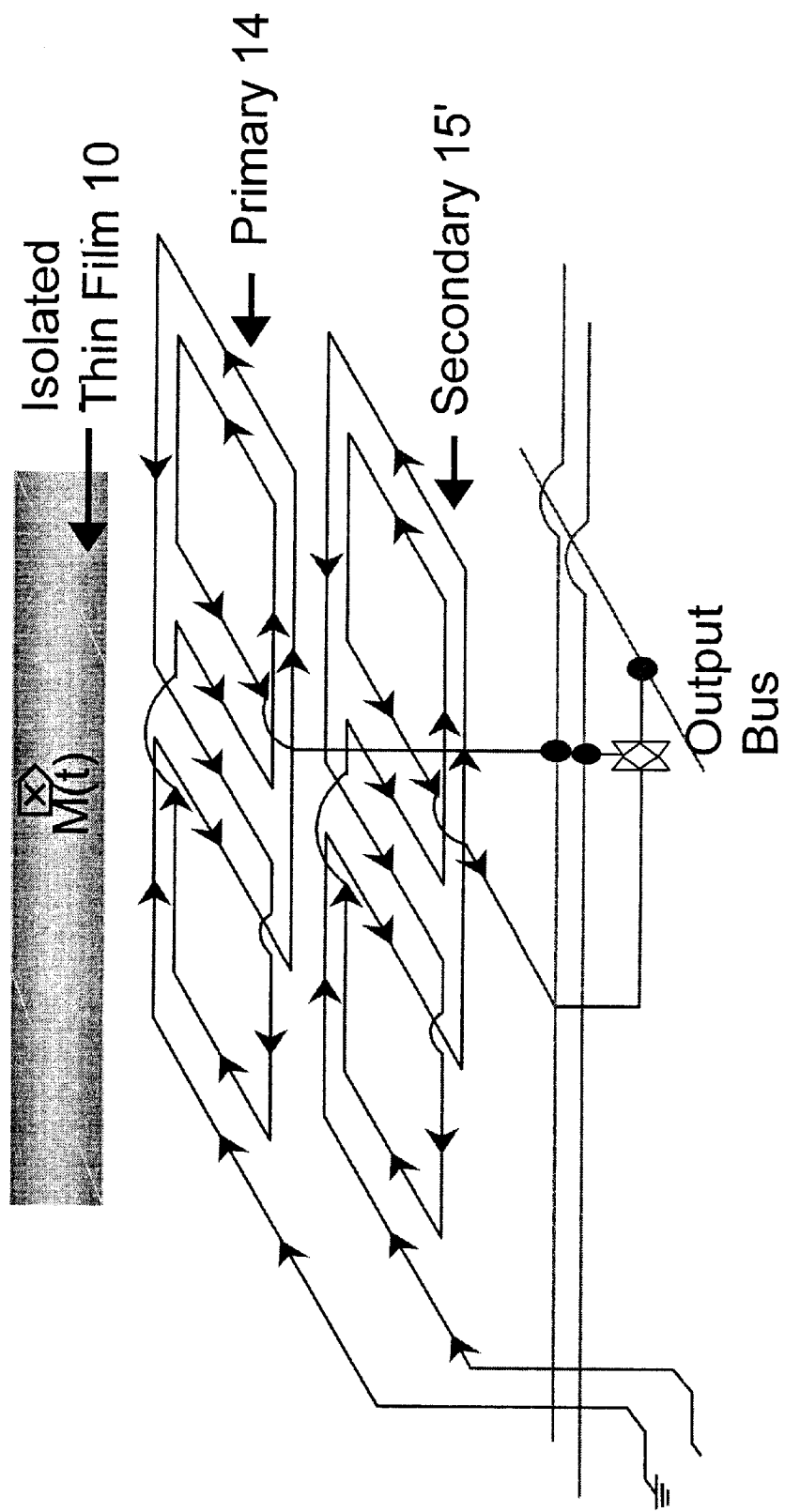
FIG. 2B is an illustration of the pixel structure for a mutual inductance device wherein the primary and second inductors are both located on the pixel.

Here the change in magnetic susceptibility is measured via the change in inductance (either self or mutual) of a small planar coil PC that lies beneath the suspended pixel element as diagrammatically illustrated in FIGS. 2A and 2B.

The general principle of operation of the magnetic transition detector disclosed herein is similar to that of superconducting transition edge bolometric detector. Here, the high sensitivity of the superconducting devices operating at room temperature combines with simplicity of fabrication and ruggedness of commercial bolometer raids. Thus, instead of relying on a change in resistance, the proposed present device uses a large change in magnetic susceptibility that occurs at the paramagnetic ferromagnetic phase transition period. This phase change can be easily and sensitively measured via well known AC susceptibility measurement techniques illustrated herein.

Benefits of the Invention

The first benefit of the invention is that it eliminates the need for an electrical connection to the temperature sensitive material. This will allow for a reduction in the thermal conductivity to the device resulting in a decreased thermal noise. This reduction is important to achieve background limited performance and an NEDT of less than 20 mK with f/2 optics.

The steep change in magnetic permeability with temperature and the low Johnson noise of the pixels result in enhanced sensitivity in comparison to standard resistive devices. This high sensitivity and low noise assures that the devices will be thermal conduction noise limited. For example, the thermal sensitivity for the pixel configuration with a pixel size of 25 $\mu$m and an excitation frequency of 100 MHz, is approximately 2 nV/$\mu$K. This corresponds to pixel response of $10^5$ V/W (assuming a thermal conductance of $10^{-8}$ W/K and an absorption coefficient of 0.5). In comparison, the Johnson noise is 8 nV (assuming the resistance of the, inductor is on the order of 1 $\Omega$ and the pixel readout bandwidth of 10 kHz). This value of Johnson noise corresponds to an input power of 0.08 pW which is a factor of ten lower than the thermal, conduction noise of 0.75 pW. Increasing the excitation frequency to 900 MHz results in signal level on the order of 18 nV/$\mu$K and a response of $9\times10^5$ V/W. Under these conditions the system is thermal conduction noise limited and thermal conductance value of $10^{-8}$ W/K will lead to a NETD of 20 mK for this device. Achieving of this level of thermal conductance is within the realm of existing microbolometer technology. Typical values of thermal conductance that have been achieved to date for VO$_x$ bolometers are in the range of $10^{-7}$ to $5\times10^{-8}$ W/K. We anticipate that our technology will result in a further reduction of the thermal conductance due to the fact that no connecting leads are required to the microbridge element. This is a significant benefit of the proposed technology because the thermal conduction to the pixel can be reduced to the lowest possible value, allowing mircrobolometer based devices to achieve the required NETD of 20 mK for f/2 optics.

Alternative readout approaches with higher sensitivities, but requiring more complex pixel ROIC's, are also possible. As shown herein, one approach is to place the primary coil on the pixel (i.e., adding another coil and driving circuit to the pixel structure shown in FIG. 1). This will result in a response of approximately $2.5\times10^5$ V/W with a 100 MHz excitation or $2.25\times10^6$ V/W using a 900 MHz excitation. This places the possibility of background limited performance firmly in view.

On the developmental side two key benefits of the invention are the strong foundation provided by the magnetic recording field and the considerable flexibility and ease of processing associated with the magnetic measurement approach. Many of the requirements associated with the development of the magnetic transition edge device are similar to those in the magnetic recording field. Specifically, the requirements are for small heads that are capable of sensing submicron scale magnetization changes in magnetic media. This technology base is a significant benefit since much of the theory, models, calculation tools, processing procedures, data, and measurement processes are established.

The magnetic measurement approach and the simple materials employed assure that the proposed effort will not be a materials development effort. The lack of connecting leads to the thermal sensing element and the simple materials used benefit the development by providing an additional degree of design flexibility. The materials used for the device are simple binary metal alloys that exhibit ferromagnetic behavior with a transition temperature near room temperature. These alloys can be fabricated from a range of metals (ferromagnetic metals Fe, Ni, and Co alloyed with Pd, Cu, Rh, Ag, Au, etc) using standard processing procedures. This simplicity enables the use of standard CMOS and silicon MEMS processing procedures to produce isolated, low thermal mass microbolometer devices with on chip readout electronics.

Finally, the overall benefit is that the high sensitivities achievable with this magnetic transition edge sensor technology will allow for a reduction in IR imaging system size and cost. This is achieved by reducing the optical aperture size as well as using less expensive optical materials. This improved performance will open up new markets for IR imagers such as automotive applications further driving the cost down of the sensors and making widespread military application more feasible.

The transition edge device technology disclosed herein has several applications ranging from sensitive uncooled IR cameras with reduced optics size to cooled highly sensitive IR and mm-wave imagers, particle calorimeters, and highly sensitive thermometers.

The features of the invention include:

The use of the ferromagnetic transition for the development of sensitive bolometers and microbolometers for such applications as IR imaging, non-contact temperature measurement, and other related applications;

The use of the ferromagnetic transition for the development of sensitive thermometers for control applications such as tunable laser diode temperature control;

The use of the ferromagnetic transition for the development of sensitive thermometers for process monitoring and calorimetric applications such as microcalorimetry devices;

Specific device designs including interrogation methods for ferromagnetic transition edge devices; and Specific materials fabrication and processing steps associated with the development and optimization of the ferromagnetic transition edge devices.

There are several commercial products that can be developed as part of the proposed effort. These products include:

Low cost commercial IR imagers with reduced optics size for surveillance, preventative maintenance, process monitoring, and nondestructive testing applications, Low cost IR imagers for automobiles Devices for non-contact temperature measurement;

Highly sensitive thermometers for control and microcalorimetry applications;

Detectors for Fourier Transform Infrared (FTIR) spectrometers;

Linear arrays for IR band spectroscopy applications;

Imaging arrays for IR band imaging and hyperspectral imaging applications;

Microcalorimeters for particle detection; and

Imaging arrays for mm-wave astronomy applications.

The technical rationale for the transition edge microbolometer technology involves four key elements:

1. Broadband microbolometer detection;
2. Highly sensitive ferromagnetic transition edge operation;
3. Implementation of pixel level sensitive magnetic measurement schemes that are scalable to large arrays; and
4. Incorporation of magnetic pixel structures with enhanced IR absorption.

Bolometric detectors have been in use for many years. These devices detect radiation via radiation-induced heating of the detector element. The broadband wavelength responsivity (from X-ray to mm wave), wide electrical frequency response (from DC to kHz), and often minimal detector cooling requirements, as well as inherent ruggedness, have made these devices the detector of choice for many classical remote sensing and radiation detection applications.

Recently, bolometric type detectors have become even more attractive for imaging applications due to the application of MEMS processing procedures. Specifically, MEMS processing procedures have been used to fabricate imaging devices consisting of arrays of individual, isolated bolometric detectors (microbolometer device). The individual detectors are isolated from the substrate via a free standing microbridge structure as shown in FIG. 1. These microbridge elements are fabricated using conventional MEMS processing steps. Because each microbridge pixel element is small and isolated from its neighbors and from the substrate, the response time and sensitivity of the elements are improved.

The second key element of the technical rationale is the transition edge detection operation. The sensitivity of a thermistor-based microbolometer array depends strongly on the thermal coefficient of resistance (TCR) of the detector material, which is considerably enhanced at a phase transition. However, to be effective for a sensor application the phase transition must be reproducible across the sensor (high pixel to pixel uniformity) and have zero hysteresis.

It is an experimentally established fact that magnetic alloys exhibit a large, steep, and reversible change in the magnetic permeability at the Curie temperature. This effect is called the Hopkinson effect and dates from the late 1800's. The steep change in AC susceptibility (permeability) with temperature over the transition region is responsible for a high dL/dT of an inductor "filled" with the material-hence, the high sensitivity of the proposed approach.

Figure 5:
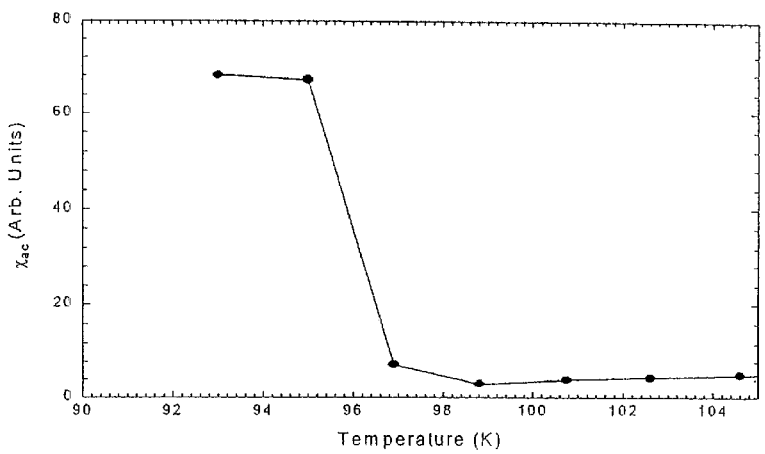
FIG. 5 is a plot of the typical ferromagnetic phase transition for a PdFe alloy of 3 atomic % Fe.
Figure 6:
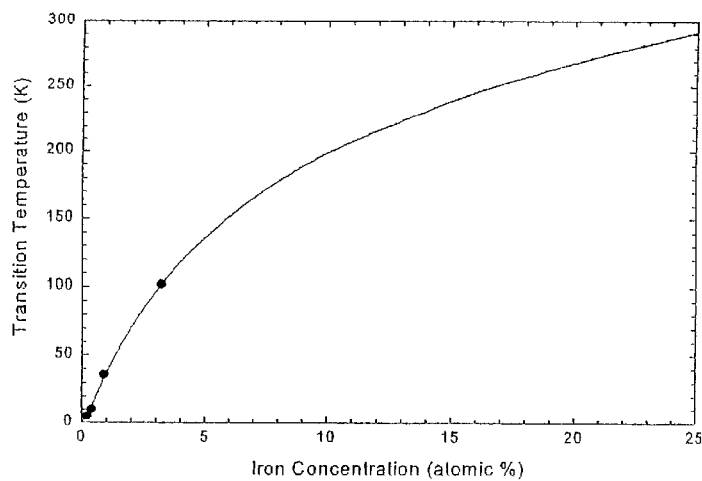
FIG. 6 is a plot showing the ferromagnetic phase transition temperatures for PdFe alloys as a function of iron concentration (Note: The plotted points are actual magnetic transition temperatures; the solid line in the curve is the theoretical prediction for the transition temperature.)

The width of the transition region depends on the alloy homogeneity. The starting alloy that we will investigate is PdFe. As shown in FIGS. 5 and 6, PdFe alloys exhibit the Hopkinson effect with very narrow ferromagnetic transitions and with Curie temperatures of room temperature achievable. PdFe has been chosen because it is a simple binary alloy with a low concentration of iron required for ferromagnetism in the alloy, good metallurgy, and ease of processing. As shown in FIGS. 5 and 6, an alloy of approximately 3 atomic % Fe in Pd will have a Curie temperature near 100 K. We are confident that PdFe alloys will continue to exhibit very narrow transitions over a wide range of transition temperatures and that excellent pixel uniformity can be achieved for two reasons. First, the Hopkinson effect is not dependent on the value of the Curie temperature (i.e., it is not strictly a low temperature phenomena). Secondly, the Curie temperature of PdFe does not vary strongly with composition for Curie temperatures above 100 K. Finally, in addition to its magnetic properties, palladium is an extensively researched material that has been used in electrical interconnects and for the development of devices. Thin films of the PdFe alloys can be deposited on a number of substrates including Si and $SiO_2$ using conventional thermal vapor deposition or sputtering technologies.

The third critical element is the read out circuit. This circuit must be both highly sensitive and scalable to large arrays (300×300 and larger). Here, there are several options as the ferromagnetic phase transition can be sensitively probed using a range of standard magnetic measurement techniques that can be implemented at the pixel level. These methods include:

High frequency inductive techniques based on fabrication of small inductors on the pixels (i.e., 1 MHz to 1 GHz); and Low frequency methods (1 Hz to 1 MHz) based on the integration of Giant Magnetoresistive (GMR) or other tunneling type devices into the pixel elements to sense a change in PdFe material permeability (so called spintronics approaches).

While both of these general techniques can be implemented using standard device processing procedures the first is the simplest to implement. The inductor can be easily integrated with silicon MEMS processing techniques to form the microbolometer pixel elements similar to that shown in FIGS. 1 and 2. These elements can be integrated with other on chip circuitry to form complete devices (i.e., output bus drive transistor, access transistor, shift registers, etc).

Figure 4A:
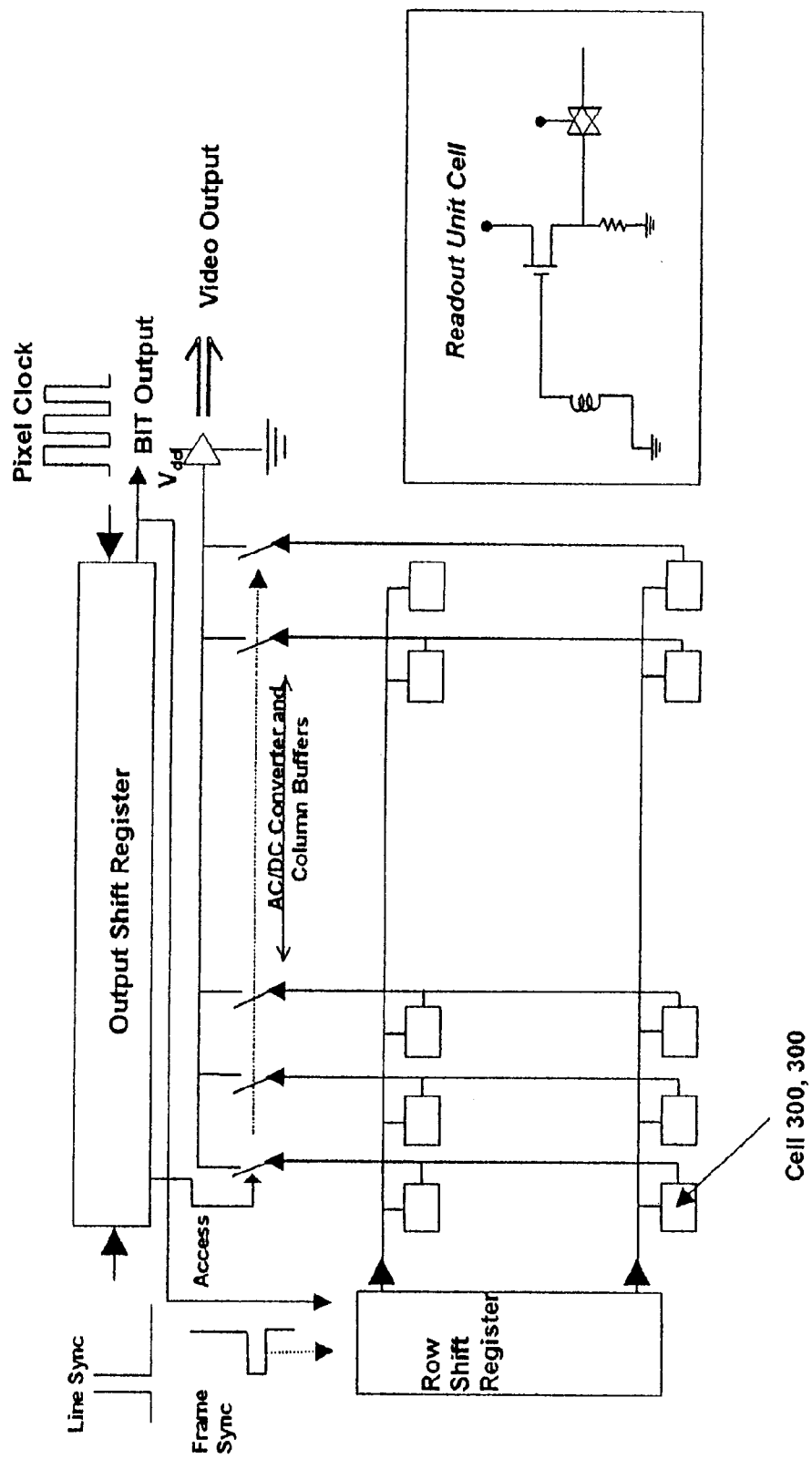
FIG. 4A is a schematic illustration of the circuit readout block diagram.
Figure 4B:
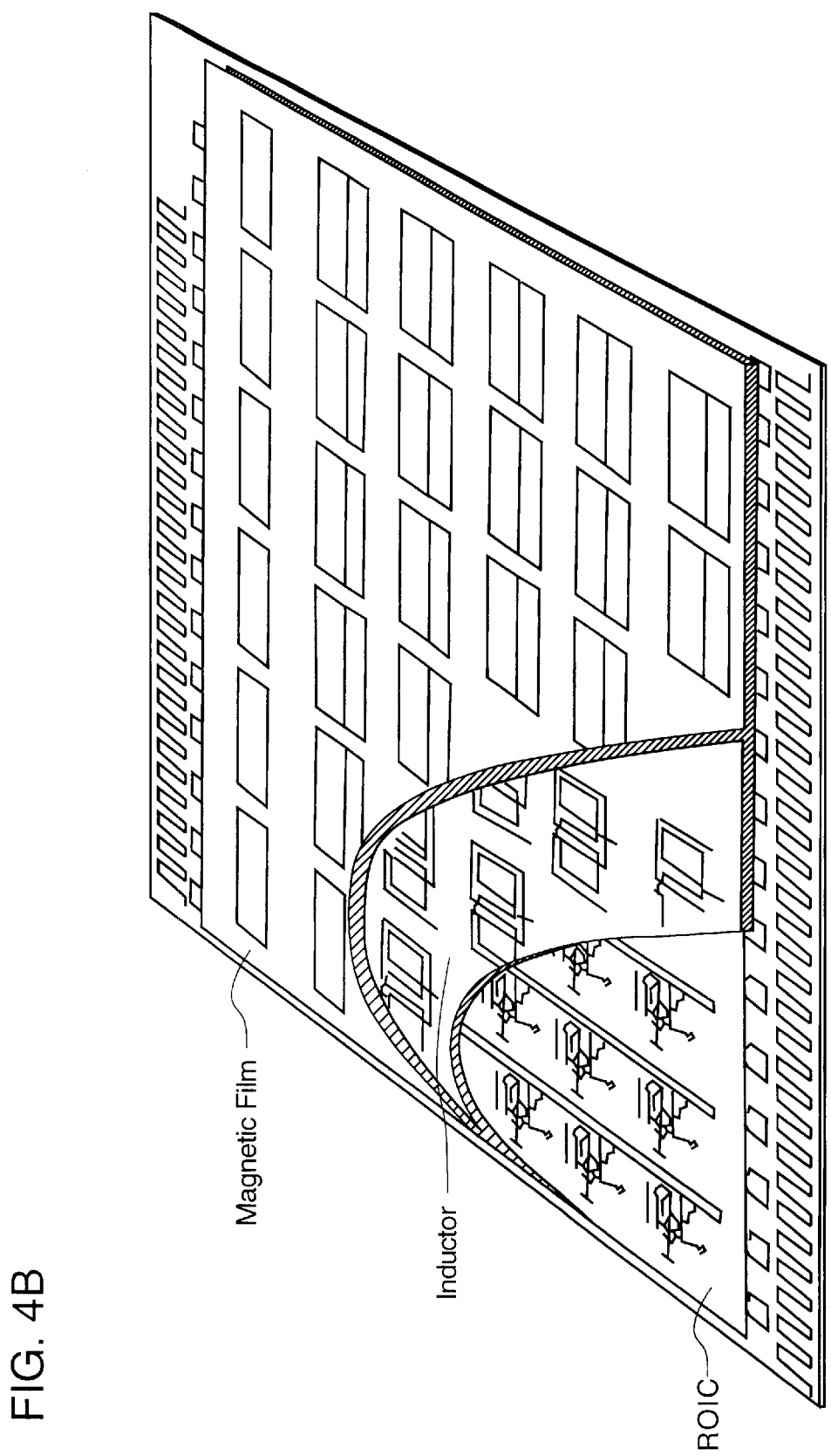
FIG. 4B is an infrared focal plane array incorporating the invention.

The technical rationale for the read out IC, shown in FIG. 4A, is straightforward. A high frequency (100 MHz) external oscillating magnetic field induces a time varying magnetization in the magnetic film. The strength of this magnetization depends on the AC magnetic permeability of the material (which has a strong temperature dependence at the Curie temperature). An induced EMF is generated in the pick up coil that is proportional to the magnetic permeability. This voltage is buffered and applied to the output bus via a low output impedance transistor (large area device). As shown in FIG. 4A, this voltage is then sensed and converted to a "DC" video value by AC/DC converters and column buffers. In this approach the array is read out row by row into the output shift register. A row shift register provides the access signal to the pixels. In addition, other more complicated read out techniques can also be implemented. These techniques include providing AC/DC conversion, at the pixel level or including a primary at the individual pixels as opposed to a large outer primary that provides magnetic excitation for all pixels simultaneously.

The final key element of the proposed microbolometer device is the efficient absorption of radiation by the pixels. Since the temperature sensitive material is a metal, the IR absorption will be low. To achieve high sensitivity it will be necessary to enhance the absorption of the IR radiation. Two different coupling schemes can be employed. The first scheme is direct absorption of the incident radiation by the pixel element such as absorption by a "black" high emissivity coating. This approach has merit as PdFe forms a very compact, black oxide layer at low processing temperatures. The second approach is to develop a "quarter wave cavity" structure to efficiently absorb the IR radiation. Both approaches will be investigated as part of the proposed effort.

Performance Estimate

The performance estimate for the device shown in FIG. 1 will now be discussed. This device uses an external primary winding to provide the magnetic excitation field for all of the pixel. As discussed above this approach has the simplest read out circuit and pixel structure. In this approach an external primary coil provides an oscillating magnetic field in the plane of the magnetic film. The underlying coil picks up the change in magnetization of the film. This coil has an optimized geometry to strongly couple flux from the thin film. The induced EMF as a function of the material magnetization (permeability) can be calculated via the reciprocity principle used in magnetic recording calculations. This principle states that the induced EMF in the secondary can be calculated from the overlap integral of the magnetization M, with the magnetic field H, produced by the pick up coil from a current i and in the absence of the magnetic material. The reciprocity principle is:

$$e = \iiint d^3r \frac{\mu_0 \vec{H}(\vec{r})}{i} \cdot \frac{\partial \vec{M}(\vec{r},t)}{\partial t},$$

where e is the induced EMF, H(r) is the magnetic field due to a current i in the pick up coil, and M(r,t) is the time varying magnetization. The integral is taken over the volume of the magnetic material. From basic magnetism we know that the magnetization M is:

$$\vec{M}(\vec{r},t) \approx \chi_{AC} \vec{H}_{applied},$$

and $$\frac{\partial \vec{M}(\vec{r},t)}{\partial t} = \chi_{AC} \vec{H}_0 \omega.$$

The maximum value of $\chi_{AC}$ is 1/N were N is the demagnetization factor for the sample. For a thin plate magnetized parallel to a face the demagnetization factor is approximately zero, resulting in a large value of $\chi_{AC}$ (on the order of 100).

Figure 7:
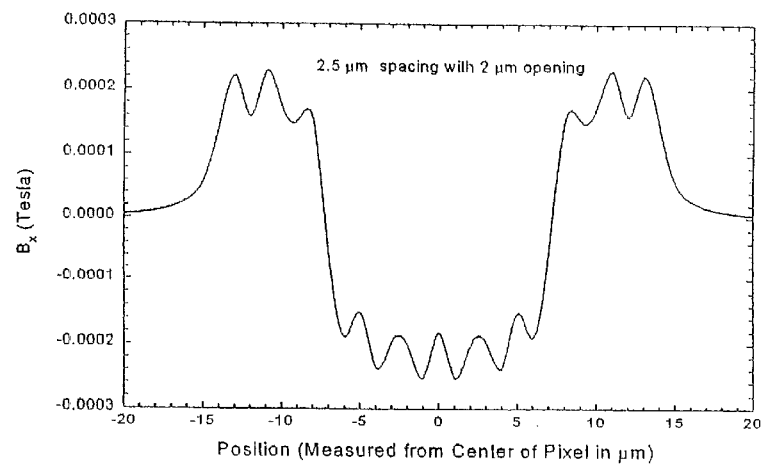
FIG. 7 is a plot of a magnetic field from pick up (secondary) coil used to calculate induced EMF using the reciprocity theorem, the coil geometry has been optimized to confine the field to a pixel and provide maximum coupled flux for a sample magnetized in the x direction.

The coil geometry shown in FIG. 1, has been chosen to optimize coupling between H and M as shown in FIG. 7, where we plot $\mu_0 H_x = B_x$, the field produced by the pick up coil with a current of 1 mA, at a distance of 1 $\mu$m above the coil. This plot suggests that optimum magnetic element size is 14 $\mu$m in the direction of the applied field, resulting in a fill factor on the order of 50% for a 25 $\mu$m pixel. This fill factor is comparable to that achieved in existing devices. The coil structure consists of 12 turns with the turns spaced 2.5 $\mu$m with a 2 $\mu$m opening between the turns that carry current in opposite directions (i.e., 6 center turns spaced 2.5 $\mu$m opening and then 3 outer turns on each side again spaced 2.5 $\mu$m).

Figure 3:
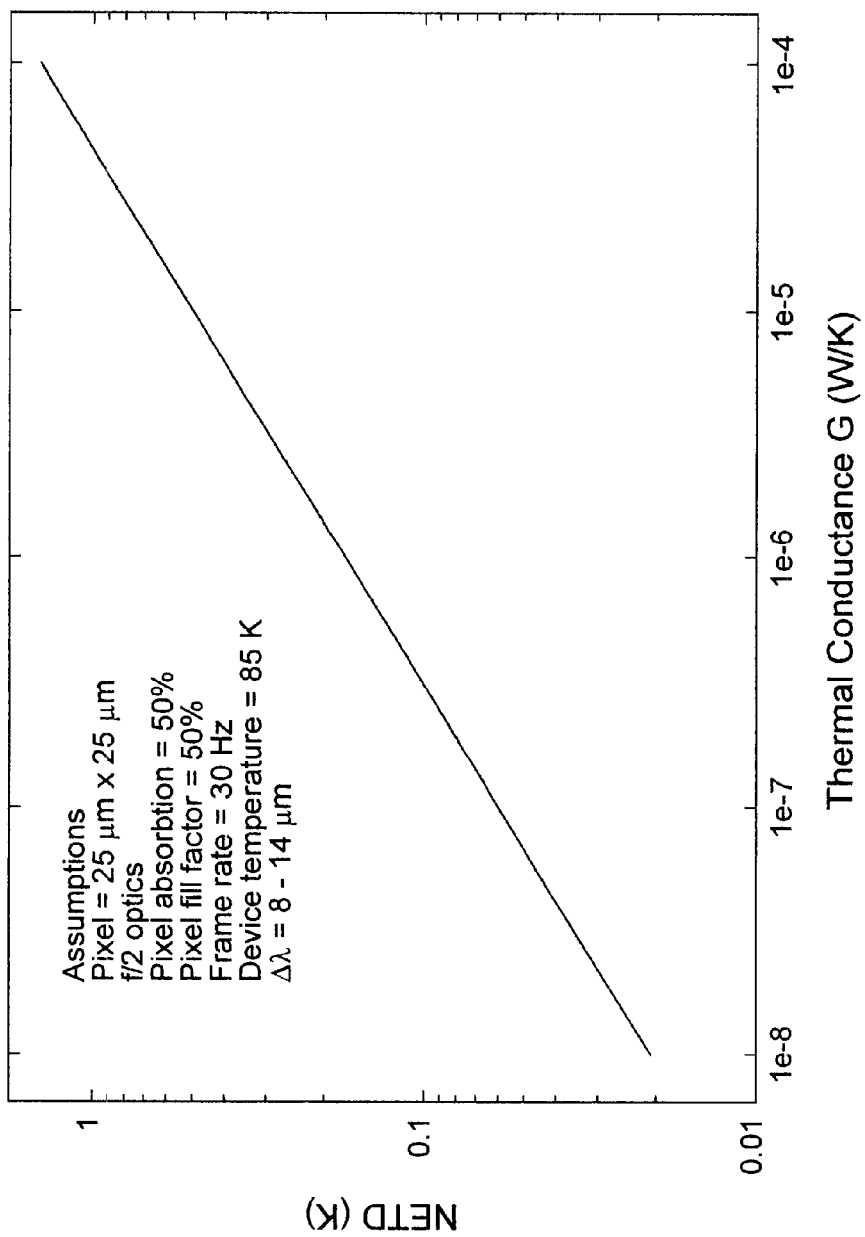
FIG. 3 is a graph illustrating the temperature fluctuation noise limit for a cooled thermal detector array.

Based on this coil geometry, a 100 Gauss external field, a maximum value of $\chi_{AC}$ of 100, and a transition width of 2 K, we calculate the signal levels given in Section A.2 (i.e., 2 nV/$\mu$K for 100 MHz excitation and 18 nV/$\mu$K for 900 MHz). Taking the thermal efficiency (dT/dP) as $5 \times 10^7$ K/W and a read out bandwidth of 10 kHz, we find, again as discussed in Section A.2, that the device is thermal conduction noise limited. From FIG. 3, it is estimated that such a device will be able to achieve the required NETD of 20 mK for an f/2 optical system. (Note: The 10 kHz read out bandwidth corresponds to the column read out time for an array of 300×300 pixels, i.e., 300 pixels * 30 frames/second corresponds to a column pixel clock of 9 kHz ≅10 kHz.)

The performance estimate of the more complicated device (primary and secondary both on a pixel) is based on the following parameters:

TABLE 1

Device Parameters Used In Calculation of the Sensitivity for Mutual Inductance Device with Primary winding on Pixel.

| | |
|---|---|
| Pixel Size | 25 × 25 $\mu$m$^2$ |
| Mutual Inductance at center of transition | 9.3 nH |
| dM/dT | 7.6 nH/K |
| Resistance of inductor (R) | 1 $\Omega$ |
| dT/dP for the pixel | 5 × 10$^7$ K/W |
| Excitation current | 1 mA |
| Excitation frequency (f$_{op}$) | 900 MHz |
| Detector bandwidth f$_{bw}$ | 10 kHz |

(Note dM/dT is the rate of change in inductance with temperature and dT/dP is the thermal response of the pixel.)

These parameters lead to a sensitivity of 45 nV/$\mu$K pixel temperature and a pixel responsivity of 2.25×10$^6$ V/W. Again, based on the facts that the system is thermal conduction noise dominated, and that 10$^{-8}$ W/K thermal conduction values are possible, we strongly believe that the proposed ferromagnetic transition edge microbolometer can achieve 20 mK NETDs for an f/2 optical system. The generation of these parameters is discussed below.

The inductance parameters used are based on calculations and from a publication on multi-level inductors (see references at the end of this section). In particular, the reported inductance values ranged from 10 to 30 nH for approximately 200×200 $\mu$m$^2$ inductors. Decreasing the size of the inductor to 25×25 $\mu$m$^2$ will inductance scales with coil radius. Incorporating the PdFe film we estimate that the maximum self-inductance value will increase to approximately 24 nH assuming a middle range self inductance value and roughly a factor of 10 due to the permeable PdFe material. The maximum mutual inductance can be estimated as 0.5(L$_p$*L$_s$)=17 nH and the minimum mutual inductance is 1.7 nH. Assuming that the transition: is 2 K wide, we obtain a value of dM/dT=7.6 nH/K, which leads to the sensitivity values listed above.

While the invention has been described in relation to preferred embodiments of the invention, it will be appreciated that other embodiments, adaptations and modifications of the invention will be apparent to those skilled in the art.

What is claimed is:

1. A microbolometer comprising:
   a support substrate having an interrogation surface,
   a film of a temperature sensitive magnetic material mounted in spaced isolation from said interrogation surface,
   an interrogation inductor formed on said support substrate facing said film, and
   a readout circuit on said interrogation surface and electrically connected to said interrogation inductor.

2. The microbolometer defined in claim 1 wherein said material has a steep, reversible change in its AC magnetic susceptibility at the magnetic Curie temperature.

3. A ferromagnetic transition edge bolometer adapted to reversibly change the low field magnetic susceptibility in the region corresponding to the onset of ferromagnetism (ferromagnetic Curie temperature) in response to incident radiation, comprising:

- a ferromagnetic metal alloy thin film comprising an alloy of ferromagnetic metal with a paramagnetic metal fabricated to have a Curie temperature in the range of 0.1 K to 350K,
- a support substrate,
- a measuring circuit to measure the low field susceptibility,
- AC susceptometer with a first circuit to establish a high frequency magnetic flux and measure the flux linked to the magnetic sensor elements, including a primary and secondary inductor flux linked to said film and a second circuit to measure any voltage induced in said secondary inductor.

4. The bolometer defined in claim 3 wherein there is an array of said transition edge bolometer.

5. The bolometer defined in claim 4 wherein said primary inductor is a single inductor which is flux linked to the ferromagnetic film and a circuit to measure any change in self inductance.

6. The bolometer defined in claim 3 wherein said support substrate is, selected from glass, $SiO_2$ silicon nitride or sapphire.

* * * * *